(12) United States Patent
Miyashita

(10) Patent No.: US 8,184,432 B2
(45) Date of Patent: May 22, 2012

(54) ELECTRO-OPTIC DEVICE AND ELECTRONIC DEVICE

(75) Inventor: Tomoaki Miyashita, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 103 days.

(21) Appl. No.: 12/754,075

(22) Filed: Apr. 5, 2010

(65) Prior Publication Data

US 2010/0271783 A1 Oct. 28, 2010

(30) Foreign Application Priority Data

Apr. 27, 2009 (JP) ................................. 2009-107370

(51) Int. Cl.
*H05K 7/00* (2006.01)

(52) U.S. Cl. .................... 361/679.21; 361/728; 361/807; 349/58; 349/62

(58) Field of Classification Search .......... 361/679.01–679.02, 679.21–679.22, 361/715, 728, 730, 717–722, 751–752, 760, 361/807
See application file for complete search history.

(56) References Cited

U.S. PATENT DOCUMENTS

| 6,882,480 | B2 | 4/2005 | Yanagisawa | |
| 7,969,741 | B2* | 6/2011 | Hayakawa et al. | 361/708 |
| 2006/0082697 | A1* | 4/2006 | Saitoh et al. | 349/58 |
| 2007/0195222 | A1* | 8/2007 | Hirabayashi et al. | 349/58 |
| 2010/0123850 | A1* | 5/2010 | Miyashita | 349/58 |

FOREIGN PATENT DOCUMENTS

| JP | 2004-70116 A | 3/2004 |
| JP | 2005-134567 A | 5/2005 |
| JP | 2005-215335 A | 8/2005 |
| JP | 2006-276624 A | 10/2006 |

* cited by examiner

*Primary Examiner* — Courtney Smith
(74) *Attorney, Agent, or Firm* — AdvantEdge Law Group, LLC

(57) ABSTRACT

An electro-optic device includes an electro-optic panel and a holding member provided with a heat emitting portion on the side opposite to a surface to which the electro-optic panel is adhered by an adhesive. In the electro-optic device, a groove portion to be filled up with the adhesive is provided in a portion of the holding member to which the electro-optic panel is adhered.

10 Claims, 7 Drawing Sheets

ELECTRO-OPTIC DEVICE AND ELECTRONIC DEVICE

BACKGROUND

1. Technical Field

The present invention relates to a technical field of an electro-optic device such as, for example, a liquid crystal device, and an electronic device such as, for example, a liquid crystal projector including the electro-optic device.

2. Related Art

The electro-optic devices of this type include a reflective electro-optic panel that displays an image by modulating, for example, incident light by the pixel unit and then reflecting the light. There may be concern that due to the incidence of relatively intense light when performing the display, the electro-optic panel generates heat to thereby cause a remarkable rise in temperature. For this reason, for example, JP-A-2005-134567 discloses a technique that enables efficient heat emission by filling up a concave portion provided in a holding member that holds the electro-optic panel with a thermal conductivity filler.

However, in the above-mentioned technique, there is a technical problem of causing the complexity of a manufacturing process of the holding member and the increase in a manufacturing cost, since it is required to previously provide a concave portion for filling up the holding member with a thermal conductivity filler. Further, there is a technical problem that a surface of contact of the electro-optic panel with the holding member becomes small due to a relatively large concave portion, to thereby cause a holding force against the electro-optic panel to be reduced.

SUMMARY

An advantage of some aspects of the invention is that it provides an electro-optic device and an electronic device capable of properly holding the electro-optic panel and performing efficient heat emission.

According to a first aspect of the invention, an electro-optic device is provided, which includes: a reflective electro-optic panel that displays an image by reflecting incident light, and a holding member that holds the electro-optic panel by adhesion to a back surface of the electro-optic panel with an adhesive, and has a heat emitting portion that emits heat generated in the electro-optic panel. In the electro-optic device, a groove portion to be filled up with the adhesive is provided in a portion of the holding member to which the electro-optic panel is adhered.

According to the electro-optic device of the invention, at the time of operation thereof, light is illuminated from a light source such as, for example, a white color lamp with respect to the electro-optic panel. The electro-optic panel displays an image by modulating light incident on a display surface by the pixel unit, and then reflecting the light from a reflective film such as an Al (aluminum) film. Each pixel is disposed at, for example, the display surface in a matrix form, and is electrically connected to a scanning line for supplying a scanning signal and a data line for supplying an image signal, respectively. Each pixel controls electro-optic materials such as liquid crystals which are oppositely disposed, in response to a potential of the image signal.

The electro-optic panel of the invention is held by the holding member adhered to a back surface located at the opposite side of the display surface. The holding member is adhered to the back surface of the electro-optic panel by the adhesive. Meanwhile, the "adhesive" termed here is a material in a liquid form or a cream form as required to be extended to an adhesion surface at the time of adhesion. The adhesive not only includes a function of completely fixing, for example, the electro-optic panel and the holding member to each other, but only includes a function of tightly contacting the electro-optic panel and the holding member to each other like grease. That is, the adhesive may be called a filler for burying a space between the electro-optic panel and the holding member.

The holding member has a heat emitting portion that emits heat generated in the electro-optic panel to the outside of the device. The heat emitting portion forms a structure that includes, for example, a highly heat-conductive material and has a large surface area. In addition, the heat emitting portion may include a heat-emitting fin. Since it is possible to efficiently emit heat generated in the electro-optic panel at the time of operation by being equipped with the heat emitting portion, reliability of the device can be raised.

Particularly in the invention, a groove portion to be filled up with the adhesive is provided in a portion of the holding member to which the electro-optic panel is adhered. Typically, the groove portion is plurally provided so that the volume of the groove portion per unit area of the surface provided with the groove portion is approximate to the uniformity. However, even when only one groove portion is provided, an effect described later is appropriately obtained.

In the meantime, the groove portion may be formed when the holding member is molded, and may be formed by digging the surface of the molded holding member. In addition, there is no specific limitation with respect to various types of conditions such as direction, width and depth of the groove portion.

When the electro-optic panel and the holding member are adhered to each other by providing the groove portion, the adhesive is easy to be uniformly extended over the whole adhesion surface. In particular, the adhesive which is sufficiently applied can be thinly and uniformly extended by the proper accumulation of the adhesive on the groove portion at the time of adhesion.

The adhesive is uniformly extended, so that the electro-optic panel and the holding member can be positively adhered to each other. That is, it is possible to properly hold the electro-optic panel by the holding member. In addition, it is possible to efficiently transfer the heat generated in the electro-optic panel to the holding member via the layer of the adhesive. In particular, it is possible to prevent the heat-transfer efficiency from being reduced due to the generation of an air layer in a portion where the adhesive is not extended, or the non-uniform thickness of the layer of the adhesive. Therefore, it is possible to very effectively perform heat emission in the heat emitting portion.

As described above, according to the electro-optic device of the invention, it is possible to properly hold the electro-optic panel and to perform efficient heat emission. Therefore, reliability of the electro-optic device can be improved.

In one embodiment of the electro-optic device of the invention, it is preferable that the adhesive has a higher thermal conductivity than air.

According to the embodiment, the adhesive includes, for example, a material having a relatively high thermal conductivity, thereby causing a higher thermal conductivity than air. Hereby, it is possible to positively raise heat-transfer efficiency, compared to a case where the air layer exists between the electro-optic panel and the holding member.

Therefore, it is possible to very effectively perform heat emission in the heat emitting portion.

In another embodiment of the electro-optic device of the invention, it is preferable that the amount of the adhesive is set on the basis of the volume of the groove portion.

In the embodiment, since the amount of the adhesive is set on the basis of the volume of the groove portion, it is possible to set the amount of the adhesive to an appropriate value. In particular, it is possible to prevent lack of the adhesive due to the extremely small amount thereof, or to prevent an excess of the adhesive from being not allowed to be accumulated in the groove portion due to the extremely large amount of the adhesive. Therefore, the electro-optic panel and the holding member can be positively adhered to each other by the adhesive, and the thickness of the layer of the adhesive can be set to an appropriate value. Consequently, it is possible to properly hold the electro-optic panel, and to raise heat-transfer efficiency between the electro-optic panel and the holding member.

In another embodiment of the electro-optic device of the invention, it is preferable that the heat emitting portion includes a plurality of convex portions arranged along a predetermined direction, and that the groove portion is provided along the predetermined direction.

In the embodiment, the heat emitting portion in the holding member is provided with a plurality of convex portions arranged along a predetermined direction. That is, there is provided a configuration capable of securing a relatively large surface area and realizing efficient heat emission by the arrangement of a plurality of convex portions.

Particularly in the embodiment, since the groove portion in the holding member is provided in the same predetermined direction as that of the arrangement of the convex portion, it is easy to provide the heat emitting portion and the groove portion in the case of extruding the holding member from a mold. In particular, the holding member can be easily molded by adjusting the direction of extrusion of the holding member to the arrangement direction of the convex portion of the heat emitting portion and the direction of the groove portion. Therefore, it is possible to simplify the manufacturing process of the device, and to reduce the manufacturing cost.

Meanwhile, the direction of the groove portion and the arrangement direction of the convex portion in the heat emitting portion may not be exactly the same direction, and may be arranged to the degree of simultaneously providing the convex portion and the groove portion as described above.

According to a second aspect of the invention, an electronic device including the above-mentioned electro-optic device (also including various types of forms thereof) of the invention is provided.

According to the electronic device of the invention, since the above-mentioned electro-optic device of the invention is included, it is possible to realize various types of electronic devices such as projection-type display devices having high reliability, televisions, cellular phones, electronic diaries, word processors, viewfinder type or monitor direct-view-type video tape recorders, workstations, television telephones, POS terminals, touch panels. In addition, it is also possible to realize electrophoresis apparatuses such as, for example, electronic paper as the electronic device of the invention.

Operations and the other advantages of the invention are obvious from embodiments for carrying out the invention to be described below.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to the drawings.

Electro-optic Panel

Figure 1:
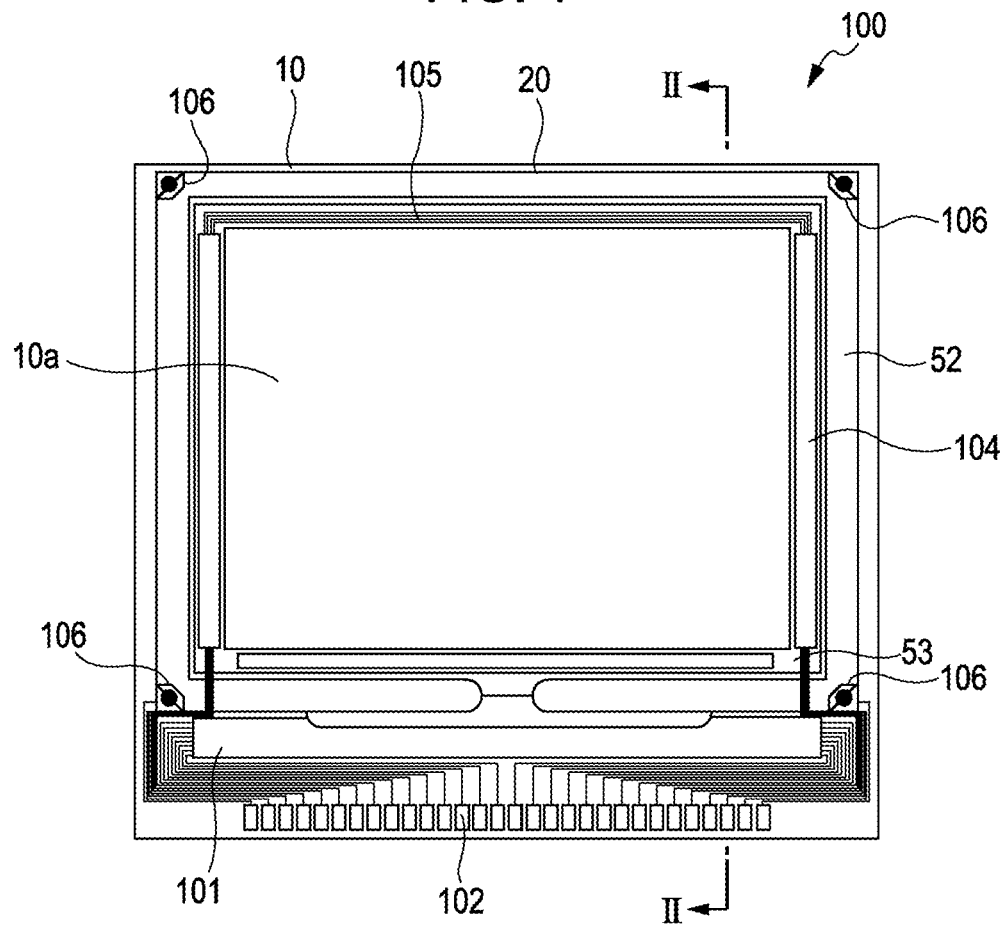
FIG. 1 is a plan view illustrating the whole configuration of an electro-optic panel according to an embodiment.
Figure 2:
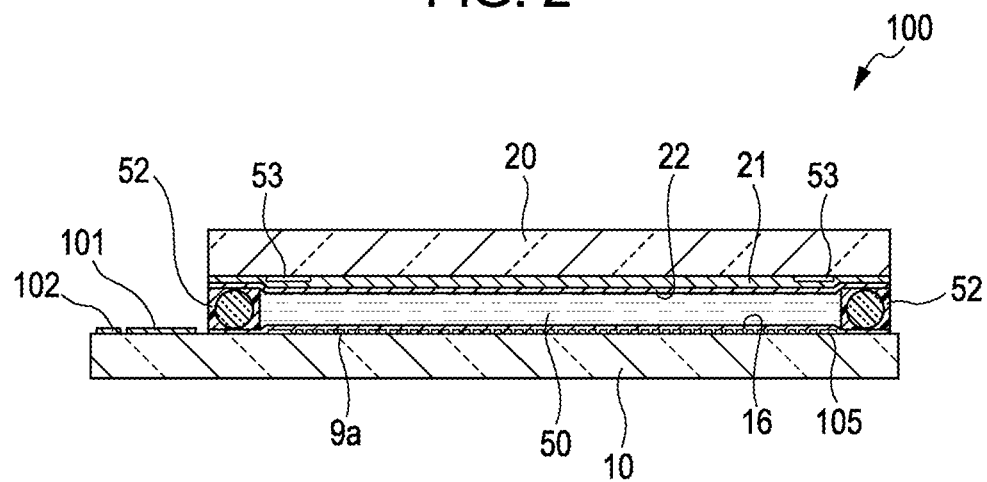
FIG. 2 is a cross-section view taken along the II-II line of FIG. 1.
Figure 3:
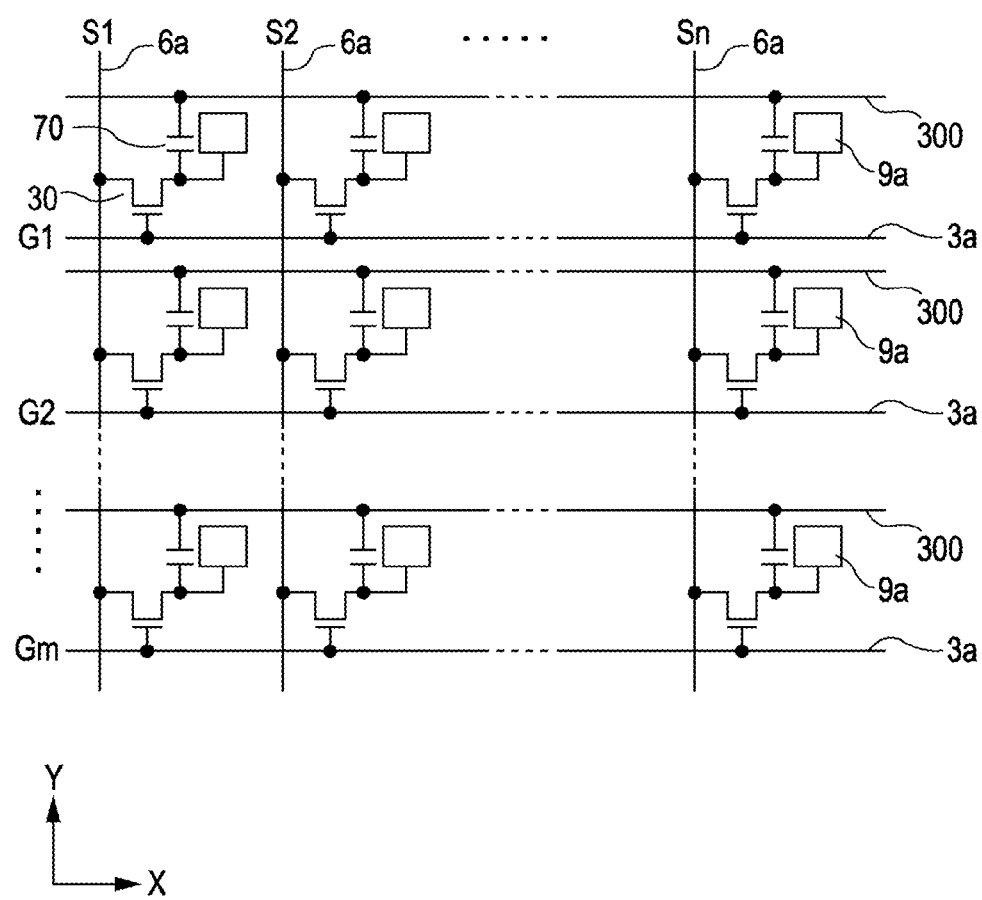
FIG. 3 is an equivalent circuit diagram of various types of elements, interconnections and the like in a plurality of pixels formed in a matrix form which constitutes an image display region of the electro-optic panel according to the embodiment.

First, reference is made to FIG. 1 to FIG. 3 to describe a reflective electro-optic panel included in the electro-optic device according to the embodiment. In the following embodiment, a driver circuit built-in TFT (Thin Film Transistor) active matrix driven liquid crystal device is taken for example.

The whole configuration of the electro-optic panel according to the embodiment will be described with reference to FIG. 1 and FIG. 2. Here, FIG. 1 is a plan view illustrating the whole configuration of the electro-optic panel according to the embodiment, and FIG. 2 is a cross-section view taken along the II-II line of FIG. 1.

In FIG. 1 and FIG. 2, a TFT array substrate 10 and an opposite substrate 20 are oppositely disposed in an electro-optic panel 100 according to the embodiment. The TFT array substrate 10 is a transparent substrate such as, for example, a quartz substrate and a glass substrate, or a silicon substrate and the like. The opposite substrate 20 is a transparent substrate such as, for example, a quartz substrate and a glass substrate. A liquid crystal layer 50 is sealed between the TFT array substrate 10 and the opposite substrate 20. The liquid crystal layer 50 is composed of, for example, liquid crystals in which a kind or several kinds of nematic liquid crystals are mixed, and takes a predetermined orientation state between a pair of oriented films.

The TFT array substrate 10 and the opposite substrate 20 are adhered to each other by a seal material 52 which is provided in a seal region located at the periphery of an image display region 10a provided with a plurality of pixel electrodes.

The seal material 52 is composed of, for example, ultraviolet-curing resin, thermosetting resin and the like for bonding both substrates together, and is a material which is applied in the TFT array substrate 10 in a manufacturing process, and then is cured by ultraviolet irradiation, heating and the like. A gap material such as fiberglass or glass beads for setting an interval (that is, inter-substrate gap) of the TFT array substrate 10 and the opposite substrate 20 to a predetermined value is scattered in the seal material 52. Meanwhile, the gap material may be disposed in the peripheral region located at the image display region 10a or the periphery of the image display region 10a, in addition to mixing the gap material in the seal material 52 or instead of it.

A frame light-shielding film 53 of an opacity defining a frame region of the image display region 10a is provided in the opposite substrate 20 side in parallel to the inner side of a seal region in which the seal material 52 is disposed. Meanwhile, all or a portion of this type of frame light-shielding film 53 may be provided in the TFT array substrate 10 side as a built-in light-shielding film.

In a region located at the outer side of the seal region in which the seal material 52 is disposed among the peripheral regions, a data line driving circuit 101 and an external circuit connecting terminal 102 are provided along one side of the TFT array substrate 10. Scanning line driving circuits 104 are provided so as to be along two sides adjacent to this one side and to be covered by the frame light-shielding film 53. Further, for the purpose of linking two scanning line driving circuits 104 together provided in both sides of the image display region 10a as just described, a plurality of interconnections 105 is provided so as to be along the remaining one side of the TFT array substrate 10 and to be covered by the frame light-shielding film 53.

Vertical conduction terminals 106 for connecting both substrates with vertical conduction materials 107 are disposed in regions opposite to four corners of the opposite substrate 20 on the TFT array substrate 10. Through these, electricity can be conducted between the TFT array substrate 10 and the opposite substrate 20.

In FIG. 2, on the TFT array substrate 10 is formed a laminated structure in which pixel switching TFTs serving as driving elements, or interconnections such as scanning lines and data lines are formed. Although the detailed configuration of this laminated structure is not shown in FIG. 2, a reflective pixel electrode 9a serving as a reflective electrode is provided on this laminated structure. The pixel electrode 9a is typically formed in an island shape in a predetermined pattern for each pixel by light reflective materials such as aluminum, and is formed so as to be capable of reflecting incident light.

The pixel electrode 9a is formed in the image display region 10a on the TFT array substrate 10 so as to be opposite to the opposite electrode 21. On a surface of the side facing the liquid crystal layer 50 in the TFT array substrate 10, that is, on the pixel electrode 9a, an oriented film 16 is formed so as to cover the pixel electrode 9a.

On an opposite surface to the TFT array substrate 10 in the opposite substrate 20, the opposite electrode 21 composed of transparent materials such as ITO is formed so as to be opposite to a plurality of pixel electrodes 9a. In addition, a color filter which is not shown in FIG. 2 may be formed in a region including a portion of an aperture region and a non-aperture region, in order to perform color display in the image display region 10a. An oriented film 22 is formed on the opposite electrode 21 on the opposite surface of the opposite substrate 20. Meanwhile, similarly to a transmissive liquid crystal device, a light-shielding film may be formed on the opposite substrate 20 in a lattice shape or a stripe shape, and a non-aperture region may be provided thereon.

Meanwhile, a sampling circuit that samples an image signal on an image signal line to supply it to the data line, a precharge circuit that supplies precharge signals of a predetermined voltage level, respectively, to a plurality of data lines ahead of the image signal, an inspection circuit that inspects the quality, defects and the like of the electro-optic panel 100 during manufacturing or at the time of shipment, and the like may be formed on the TFT array substrate 10 shown in FIG. 1 and FIG. 2, in addition to the driving circuit such as the above-mentioned data line driving circuit 101 and the scanning line driving circuit 104.

Next, reference is made to FIG. 3 to describe the electrical configuration of a pixel portion of the electro-optic panel according to the embodiment. Here, FIG. 3 is an equivalent circuit diagram of various types of elements, interconnections and the like in a plurality of pixels formed in a matrix form which constitutes an image display region of the electro-optic panel according to the embodiment.

In FIG. 3, the pixel electrodes 9a and TFTs 30 are formed in a plurality of each of the pixels formed in a matrix form which constitutes the image display region 10a. The TFT 30 is electrically connected to the pixel electrode 9a, and controls switching of the pixel electrode 9a at the time of operation of the electro-optic panel 100 according to the embodiment. A data line 6a to which the image signal is supplied is electrically connected to sources of the TFTs 30. The image signals S1, S2, . . . , Sn written in the data line 6a may be line-sequentially supplied in this order, and may be supplied for each group with respect to a plurality of data lines 6a adjacent to each other.

A scanning line 3a is electrically connected to gates of the TFTs 30, and the electro-optic panel 100 according to the embodiment is configured so that at a predetermined timing, scanning signals G1, G2, . . . , Gm are line-sequentially applied to the scanning line 3a in this order in a pulse manner. The pixel electrode 9a is electrically connected to a drain of the TFT 30, and the image signals S1, S2, . . . , Sn to be supplied from the data line 6a are written at a predetermined timing by closing a switch of the TFT 30 serving as a switching element for a certain period. The image signals S1, S2, . . . , Sn having a predetermined level, written in liquid crystals as an example of the electro-optic material via the pixel electrode 9a, are held for a certain period between the opposite electrode formed on the opposite substrate and the pixel electrode.

The liquid crystals constituting the liquid crystal layer 50 (see FIG. 2) change in orientation or order of molecular assembly due to the voltage level to be applied, which causes light to be modulated, thereby allowing grayscale display. For example, in a normally white mode, the transmittance of incident light is reduced in response to a voltage applied in units of each of the pixels, and in a normally black mode, the transmittance of incident light is increased in response to a voltage applied in units of each of the pixels. Therefore, as a whole, light having a contrast corresponding to the image signal is emitted from the electro-optic panel 100.

Here, a storage capacitor 70 is added in parallel with a liquid crystal capacitor formed between the pixel electrode 9a and the opposite electrode 21 (see FIG. 2) in order to prevent the held image signal from being leaked. The storage capacitor 70 is a capacitive element functioning as a holding capacitor that temporarily holds a potential of each pixel electrode 9a in accordance with the supply of the image signal. One electrode of the storage capacitor 70 is electrically connected to the drain of the TFT 30 in parallel with the pixel electrode 9a, and the other electrode thereof is electrically connected to a potential fixed capacitive line 300 so as to become a constant potential. According to the storage capacitor 70, the potential holding characteristics in the pixel electrode 9a can be improved, and the display characteristics of improvement in contrast or reduction in flicker can be improved.

Electro-optic Device

Next, the electro-optic device including the above-mentioned electro-optic panel 100 will be described with reference to FIG. 4 to FIG. 10.

Figure 4:
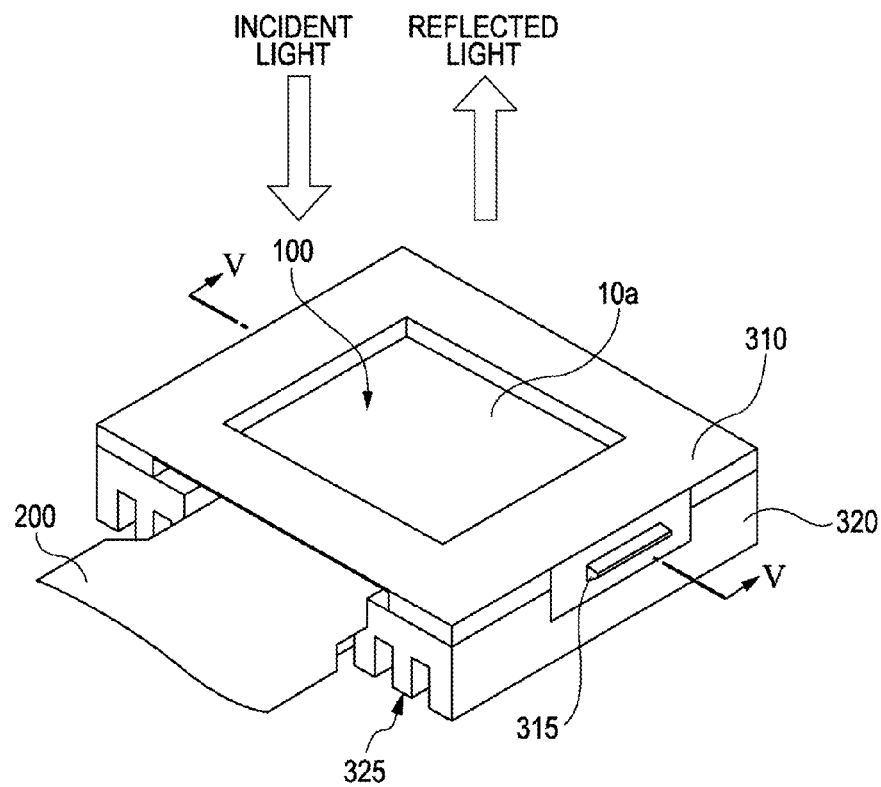
FIG. 4 is a perspective view illustrating the whole configuration of an electro-optic device according to the embodiment.
Figure 5:
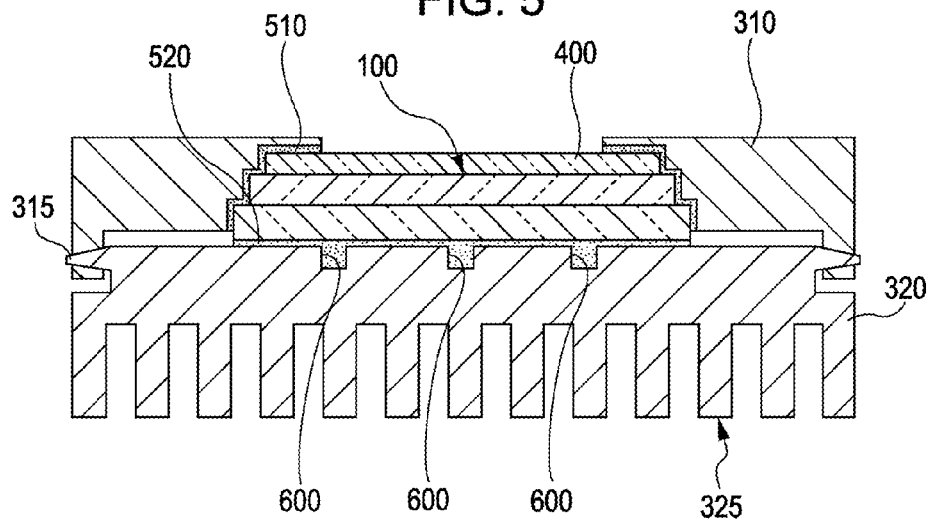
FIG. 5 is a cross-section view illustrating the specific configuration of the electro-optic device according to the embodiment.

First, the whole configuration of the electro-optic device according to the embodiment will be described with reference to FIG. 4 and FIG. 5. Here, FIG. 4 is a perspective view illustrating the whole configuration of the electro-optic device according to the embodiment, and FIG. 5 is a cross-section view illustrating the specific configuration of the electro-optic device according to the embodiment. Meanwhile, in the drawings that follow FIG. 4, detailed members in the electro-optic panel 100 shown in FIG. 1 and FIG. 2 are shown as properly omitted.

In FIG. 4, the electro-optic device according to the embodiment includes the electro-optic panel 100, a flexible substrate 200, a frame 310, and a heat sink 320.

The flexible substrate 200 including signal interconnections for sending various control signals is electrically connected to the electro-optic panel 100. The flexible substrate 200 is formed by patterning of the signal interconnections and the like in, for example, a base material such as polyimide. Meanwhile, a driving IC chip and the like including at least a portion of a driver circuit for driving the electro-optic panel 100 may be disposed on the flexible substrate 200. The flexible substrate 200 is configured so that one end on the side opposite to the other end connected to the electro-optic panel 100 is drawn on the outer side of the frame 310 and the heat sink 320, and is connected to an external circuit (not shown).

The frame 310 holds the electro-optic panel 100 from the display surface side provided with the image display region 10a. The frame 310 not only functions as a holding member that holds the electro-optic panel 100, but also functions as a restraint member that restricts light incident on the electro-optic panel 100. The frame 310 includes a metal such as, for example, iron, copper, and aluminum.

The heat sink 320 is an example of a "holding member" of the invention, and holds the electro-optic panel 100 from the back side located at the opposite side of the display surface. The heat sink 320 has a heat emitting portion 325 for emitting heat generated in the electro-optic panel 100. Hereby, it is possible to reduce the generation of defect by the heat in the electro-optic panel 100. That is, it is possible to raise reliability of the device. The heat sink 320 preferably includes highly heat-conductive materials in order to raise the effect of heat emission.

The frame 310 and the heat sink 320 are joined to each other in a joint 315. Although the joining here is typically performed by fitting a convex portion provided in the heat sink 320 into a concave portion provided in the frame 310, it may be performed by using an adhesive or a screw and the like. Meanwhile, the opposite surfaces of the frame 310 and the heat sink 320 are separately disposed to each other via an air layer. Hereby, when each of the frame 310 and the heat sink 320 is thermally expanded, it is possible to prevent the electro-optic panel 100 from suffering the damage due to stress from the frame 310 and the heat sink 320.

In FIG. 5, the electro-optic panel 100 and the frame 310 are adhered to each other by an adhesive 510. The adhesive 510 is provided from the surface of the electro-optic panel 100 to the lateral face thereof. Meanwhile, a dustproof glass 400 is bonded to the display surface of the electro-optic panel 100 as an example of a dustproof substrate. In addition, a member other than the dustproof glass 400 may be provided in the electro-optic panel 100.

The electro-optic panel 100 and the heat sink 320 are adhered to each other by grease 520. The grease 520 has a thermal conductivity higher than that of air, and can efficiently transfer the heat generated in the electro-optic panel 100 to the heat sink 320. Thus, it is possible to raise the effect of heat emission in the heat emitting portion 325. The grease 520 is an example of an "adhesive" of the invention. Groove portions 600 to be filled up with grease 520 are provided in the surface adhered to the electro-optic panel 100 in the heat sink 320. The configuration of the groove portion will be described later in detail.

Figure 6:
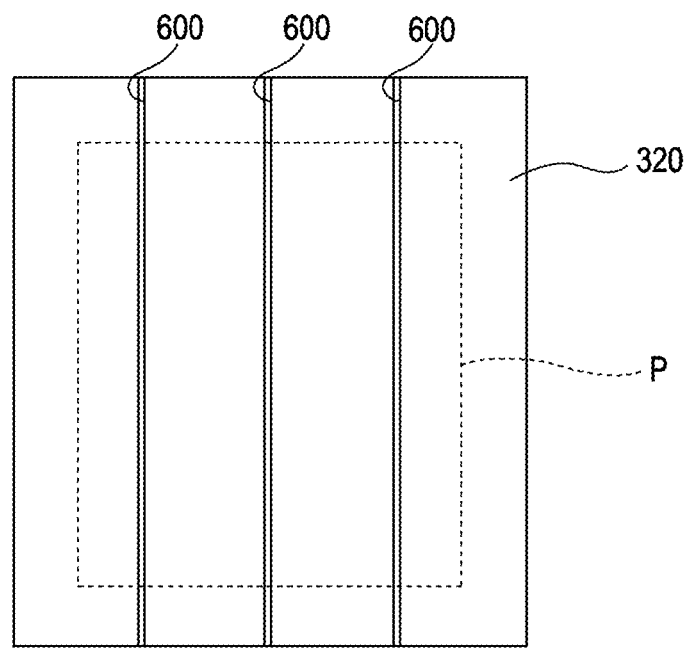
FIG. 6 is a plan view illustrating groove portions according to the embodiment.
Figure 7:
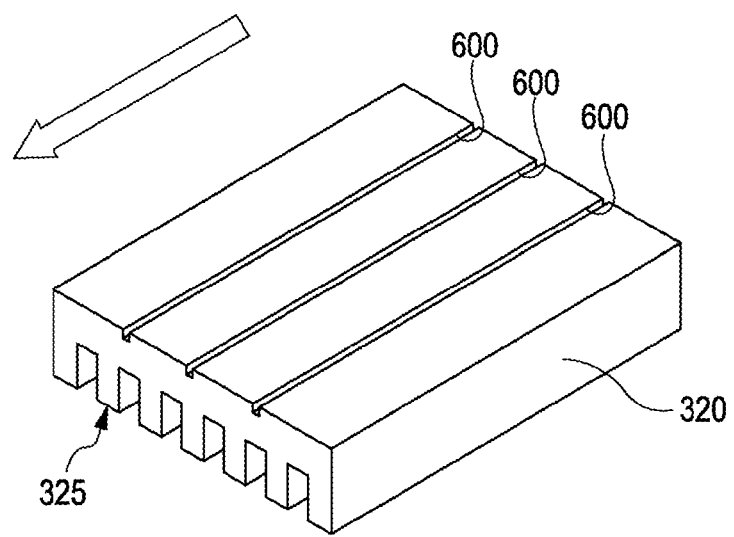
FIG. 7 is a perspective view illustrating the relationship between a direction of the groove portions and a direction of heat emitting portions.
Figure 8:
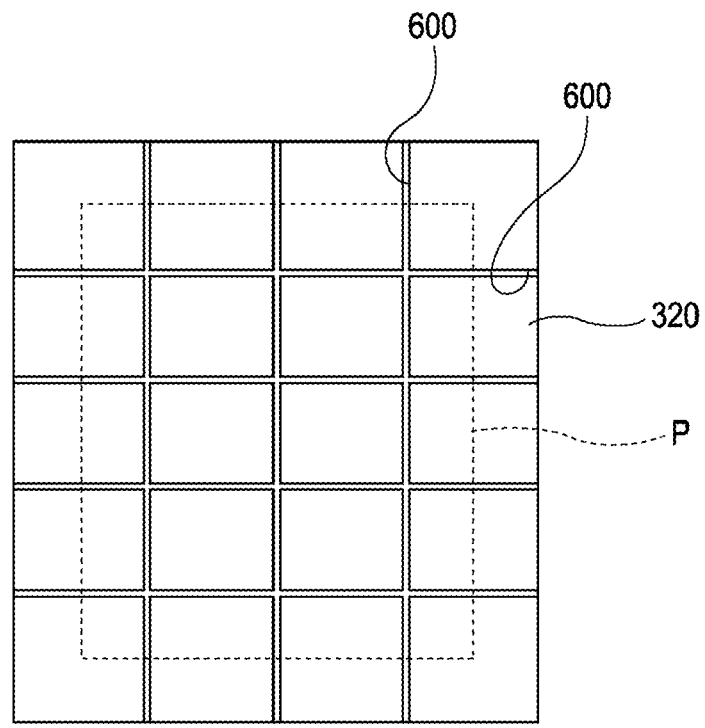
FIG. 8 is a first plan view illustrating a modified example of the groove portions according to the embodiment.
Figure 9:
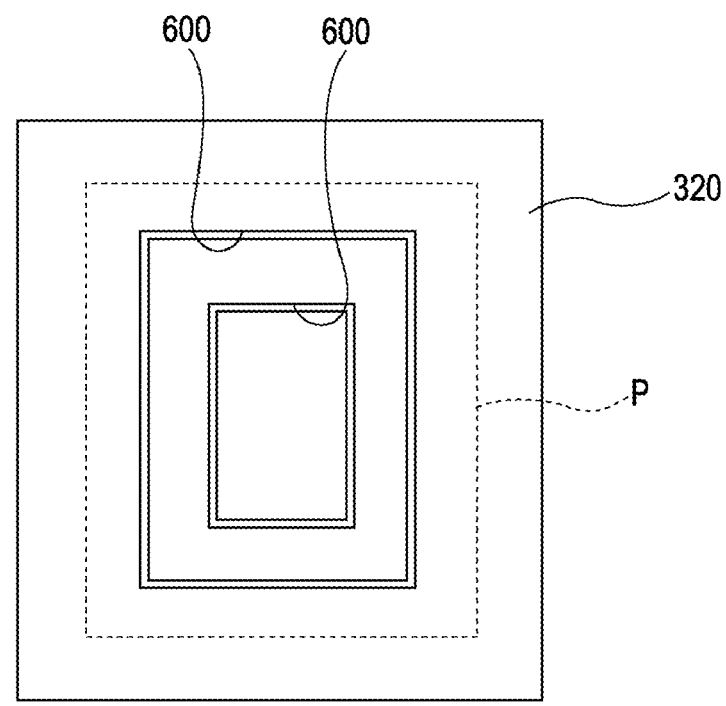
FIG. 9 is a second plan view illustrating a modified example of the groove portions according to the embodiment.
Figure 10:
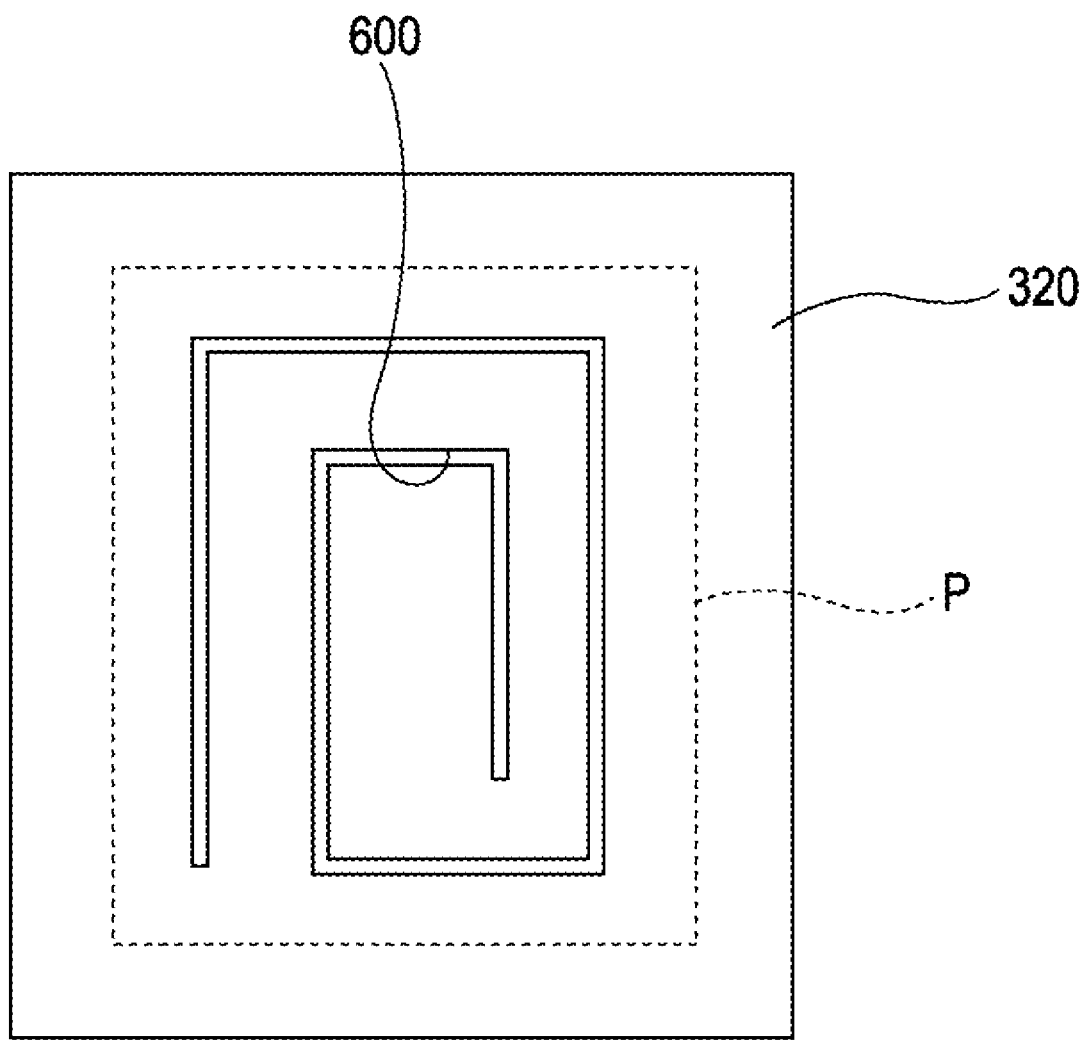
FIG. 10 is a third plan view illustrating a modified example of the groove portions according to the embodiment.

Next, the configuration of the groove portion provided in the electro-optic device according to the embodiment will be described in detail with reference to FIG. 6 to FIG. 10. Here, FIG. 6 is a plan view illustrating the configuration of the groove portion according to the embodiment, and FIG. 7 is a perspective view illustrating the relationship between a direction of the groove portion and a direction of the heat emitting portion. In addition, FIGS. 8 to 10 are, respectively, plan views illustrating modified examples of the groove portion according to the embodiment.

In FIG. 6, in the electro-optic device according to the embodiment, the groove portions 600 are provided in a region P which is adhered to the electro-optic panel 100 in the heat sink 320. Typically, the groove portion 600 is plurally provided so that the volume of the groove portion 600 per unit area in the region P is approximate to uniformity.

When the electro-optic panel 100 and the heat sink 320 are adhered to each other by providing the groove portion 600, the grease 520 serving as an adhesive is easy to be uniformly extended over the whole adhesion surface. In particular, the grease 520 which is sufficiently applied is thinly and uniformly extended by the proper accumulation on the groove portion 600 at the time of adhesion.

The grease 520 is uniformly extended, so that the electro-optic panel 100 and the heat sink 320 can be positively adhered to each other. That is, it is possible to properly hold the electro-optic panel 100 by the heat sink 320. In addition, it is possible to efficiently transfer the heat generated in the electro-optic panel 100 to the heat sink 320 via the layer of the grease 520. In particular, it is possible to prevent the heat-transfer efficiency from being reduced due to the generation of an air layer (for example, air bubbles and the like) in a portion where the grease 520 is not extended, or the non-uniform thickness of the layer of the grease 520. Therefore, it is possible to very effectively perform heat emission in the heat emitting portion 325.

Particularly here, the amount of the grease 520 is set on the basis of the volume of the groove portion 600. For this reason, it is possible to prevent lack of the grease 520 due to the extremely small amount thereof, or to prevent an excess of the grease 520 from being not allowed to be accumulated in the groove portion 600 due to the extremely large amount of the grease 520. Therefore, the electro-optic panel 100 and the heat sink 320 can be positively adhered to each other by the grease 520, and the thickness of the layer of the grease 520 can be set to an appropriate value.

In FIG. 7, the direction of the groove portion 600 is in line with the arrangement direction of the convex portion in the heat emitting portion 325. In particular, the direction of the groove portion 600 and the arrangement direction of the convex portion in the heat emitting portion 325 are all in line with the direction of the arrow in the drawing.

When the groove portion 600 in the heat sink 320 is provided in the same direction as that of the arrangement of the convex portion of the heat emitting portion 325, it is easy to provide the heat emitting portion 325 and the groove portion 600 in the case of extruding the heat sink 320 from a mold. In particular, the heat sink 320 can be easily molded by adjusting the direction of extrusion of the heat sink 320 to the arrangement direction of the convex portion of the heat emitting portion 325 and the direction of the groove portion 600. Therefore, it is possible to simplify the manufacturing process of the device, and to reduce the manufacturing cost.

In the meantime, the groove portion 600 may be simultaneously formed when the heat sink 320 is molded as described above, and may be formed by digging the surface of the molded heat sink 320.

As shown in FIG. 8, the groove portion 600 may be provided in a lattice shape. In this case, the ratio per unit area of the groove portion 600 in the region P can be made more uniformly.

As shown in FIG. 9, the groove portion 600 may be provided in a plurality of rectangular shapes of which the sizes are different. In this case, similarly to an example shown in FIG. 8, the ratio per unit area of the groove portion 600 in the region P can be made more uniformly.

As shown in FIG. 10, the groove portion 600 may be provided in a screw shape. In this case, since the groove portion can be formed as writing a stroke, it is possible to relatively easily provide the groove portion 600.

As described above, the shapes of the groove portion 600 are properly set in accordance with the sizes of each of the members or the sorts of the adhesive and the like, whereby a more remarkable effect is exhibited.

In addition, an effect by the groove portion 600 can be enhanced even by changing a method of applying an adhesive (that is, grease 520) in accordance with the shapes of the groove portion 600. For example, a good extension of the adhesive can be performed by applying the adhesive along the groove portion 600, or applying the adhesive to a portion in which the groove portion is not provided.

As described above, with the electro-optic device according to the embodiment, it is possible to uniformly extend an adhesive used for adhesion of the electro-optic panel 100 and the heat sink 320. Hereby, it is possible to properly hold the electro-optic panel 100 and to efficiently perform heat emission.

Electronic Device

Figure 11:
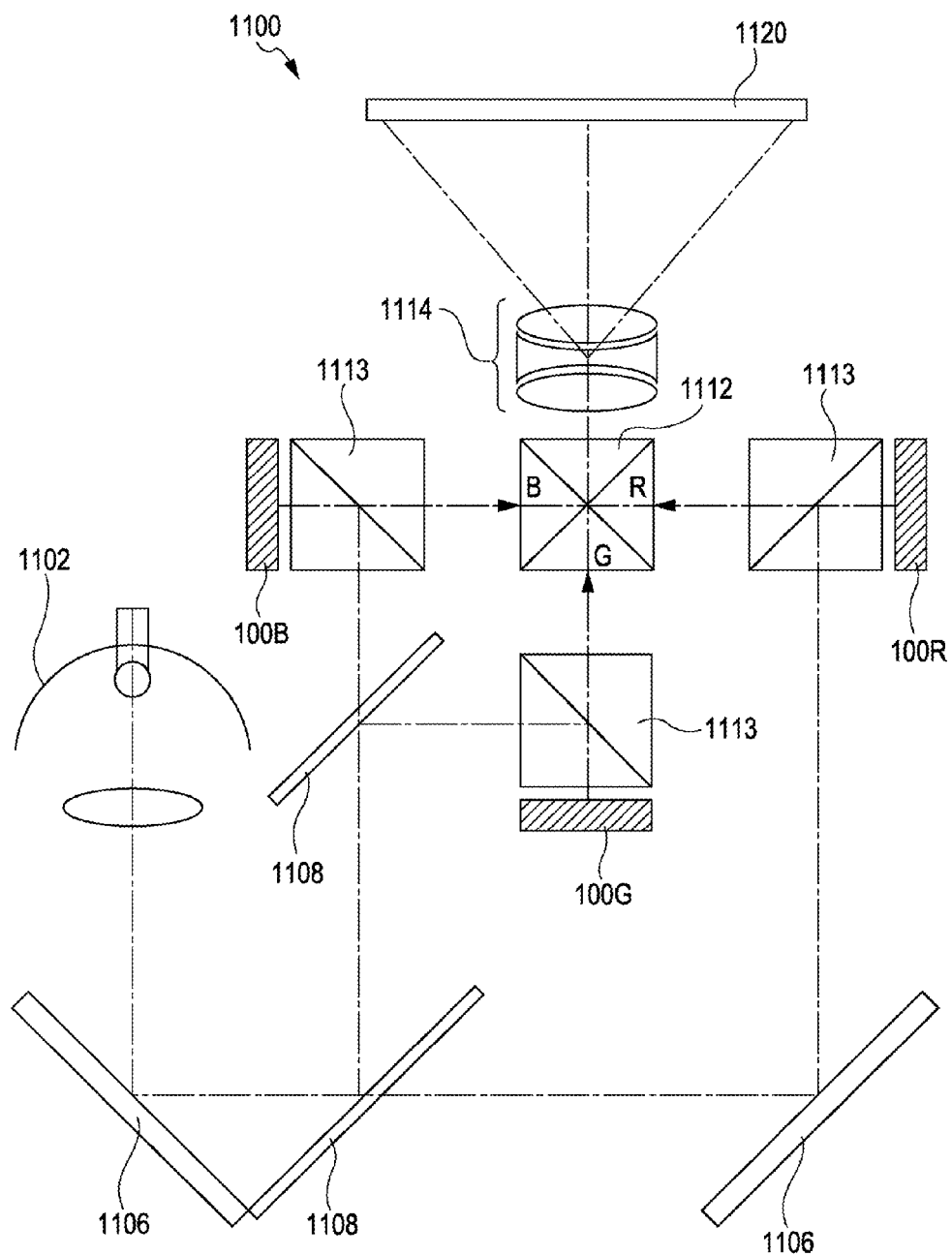
FIG. 11 is a plan view illustrating the configuration of a projector which is an example of an electronic device to which the electro-optic device is applied.

Next, a case where the liquid crystal device serving as the above-mentioned electro-optic device is applied to various types of electronic devices will be described. Herein, the electronic device according to the invention includes a projection-type liquid crystal projector as an example. FIG. 11 is a schematic cross-section view of the projection-type liquid crystal projector according to the embodiment.

In FIG. 11, a liquid crystal projector 1100 according to the embodiment is constructed as a double-plate type color projector in which three liquid crystal light valves 100R, 100G and 100B for RGB are used. Each of the liquid crystal light valves 100R, 100G and 100B uses the above-mentioned reflective liquid crystal device.

As shown in FIG. 11, in the liquid crystal projector 1100, when projection light is emitted from a lamp unit 1102 of a white light source such as a metal halide lamp, the projection light is divided into optical components R, G and B corresponding to three primary colors of RGB by two mirrors 1106, two dichroic mirrors 1108 and three polarizing beam splitters (PBS) 1113, and is guided to the liquid crystal light valves 100R, 100G and 100B corresponding to each of the colors, respectively. At this time, in order to prevent a light loss in a light path, a lens may be properly provided in the light path. The optical components corresponding to three primary colors modulated respectively by the liquid crystal light valves 100R, 100G and 100B are synthesized by a cross prism 1112, and then are projected to a screen 1120 via a projection lens 1114 as color images.

Meanwhile, since the light corresponding to each of the primary colors of R, G and B is incident on the liquid crystal light valves 100R, 100B and 100G through the dichroic mirrors 1108 and the polarizing beam splitters 1113, it is not necessary to provide a color filter.

In addition to the electronic devices described with reference to FIG. 11, included are mobile-type personal computers, cellular phones, liquid crystal televisions, viewfinder-type or monitor direct-view-type video tape recorders, car navigation devices, pagers, electronic diaries, calculators, word processors, workstations, television telephones, POS terminals, devices equipped with touch panels, and the like. Further, it goes without saying that the electro-optic device according to the invention can be applied to various types of these electronic devices.

In addition to the reflective liquid crystal device described in the above-mentioned embodiment, the invention can be also applied to transmissive liquid crystal devices, plasma displays (PDP), electrolytic emitting displays (FED, SED), organic EL displays, digital micro-mirror devices (DMD), electrophoresis apparatuses, and the like.

The invention is not limited to the above-mentioned embodiment, but may be suitably modified within a range without departing from the gist or the spirit of the invention readable from the scope of claims and the whole specification of the invention. Furthermore, the electro-optic devices and the electronic devices including such electro-optic devices, which are associated with such modification, are also included in the technical scope of the invention.

What is claimed is:

1. An electro-optic device comprising:
   an electro-optic panel having a display surface and a back side located at an opposite side of the display surface; and
   a holding member having a surface facing the back side of the electro-optic panel and a heat emitting portion on a side opposite to the surface, the surface being adhered to the back side of the electro-optical panel with an adhesive at a region on the surface directly below the electro-optic panel, the region including a groove portion for receiving the adhesive.

2. The electro-optic device according to claim 1, wherein the adhesive has a higher thermal conductivity than air.

3. The electro-optic device according to claim 1, wherein an amount of the adhesive is set on a basis of a volume of the groove portion.

4. The electro-optic device according to claim 1, wherein the heat emitting portion on the side opposite to the surface includes a plurality of convex portions arranged along a predetermined direction, and
   wherein the groove portion on the surface of the holding member extends in a same direction as the direction of the convex portions.

5. The electro-optic device according to claim 1, further comprising a frame provided on the display surface side of the electro-optic panel, the frame joined with the holding member provided at the back side of the electro-optic panel so as to create a gap formed by an air layer between the frame the holding member.

6. An electronic device comprising the electro-optic device according to claim 1.

7. The electro-optic device according to claim 1, wherein the groove portion is comprised of a plurality of grooves uniformly distributed across the region at the surface of the holding member.

8. The electro-optic device according to claim 7, wherein the grooves are arranged in a lattice shape.

9. The electro-optic device according to claim 7, wherein the grooves are arranged in a plurality of rectangular shapes.

10. The electro-optic device according to claim 1, wherein the adhesive is composed of a grease.

* * * * *